United States Patent [19]
Schneider

[11] Patent Number: 5,744,171
[45] Date of Patent: Apr. 28, 1998

[54] SYSTEM FOR FABRICATING CONDUCTIVE EPOXY GRID ARRAY SEMICONDUCTOR PACKAGES

[75] Inventor: Mark Schneider, San Jose, Calif.

[73] Assignee: LSI Logic Corporation, Milpitas, Calif.

[21] Appl. No.: 854,769

[22] Filed: May 12, 1997

Related U.S. Application Data

[60] Continuation of Ser. No. 429,628, Apr. 27, 1995, abandoned, which is a division of Ser. No. 121,678, Sep. 15, 1993, Pat. No. 5,410,806.

[51] Int. Cl.[6] .................. H05K 3/10; H05K 3/22
[52] U.S. Cl. ............. 425/110; 118/641; 118/600; 118/213; 118/255; 118/256; 118/406; 264/272.17
[58] Field of Search ............... 118/213, 256, 118/258, 255, 211, 641, 600, 406; 425/116, 117, 127, DIG. 228, 447, 449, 110; 264/272.17

[56] References Cited

U.S. PATENT DOCUMENTS

| | | | |
|---|---|---|---|
| 3,656,232 | 4/1972 | Hinchey | 264/272.17 |
| 3,706,840 | 12/1972 | Moyle et al. | 264/272.17 |
| 4,304,536 | 12/1981 | Davis et al. | 425/110 |
| 4,362,486 | 12/1982 | Davis et al. | 425/126.1 |
| 4,514,752 | 4/1985 | Engel et al. | 264/272.17 |
| 4,919,970 | 4/1990 | Hoebener et al. | 118/213 |
| 5,117,069 | 5/1992 | Higgins | 174/261 |
| 5,249,101 | 9/1993 | Frey et al. | 264/272.17 |
| 5,306,546 | 4/1994 | Schreiber et al. | 428/210 |
| 5,332,439 | 7/1994 | Watanabe et al. | 118/213 |
| 5,397,916 | 3/1995 | Normington | 257/686 |
| 5,431,863 | 7/1995 | Mochizuki et al. | 264/272.17 |

FOREIGN PATENT DOCUMENTS

| | | | |
|---|---|---|---|
| 2-303161 | 12/1990 | Japan | |
| 2212332 | 7/1989 | United Kingdom | 264/272.17 |

OTHER PUBLICATIONS

Electronic Engineer Times, p. 48, Apr. 6, 1992.

*Primary Examiner*—Khanh P. Nguyen
*Attorney, Agent, or Firm*—Katz & Cotton, LLP

[57] ABSTRACT

System for producing a plurality of semiconductor device assemblies utilizing a grid array of conductive epoxy for connecting them to an electronic system. Conductive epoxy is screen printed in a desired pattern onto a printed wire board of the semiconductor device assembly. The conductive epoxy is B-staged by heating in an oven. The semiconductor device assembly is then placed onto a system printed circuit board wherein the B-staged conductive epoxy is further cured by heat and effectively makes mechanical and electrical connections between the semiconductor device assembly and the system printed circuit board.

8 Claims, 7 Drawing Sheets

SYSTEM FOR FABRICATING CONDUCTIVE EPOXY GRID ARRAY SEMICONDUCTOR PACKAGES

This application is a continuation of application Ser. No. 08/429,628, filed Apr. 27, 1995, now abandoned, which is a divisional of commonly owned application Ser. No. 08/121,678, filed Sep. 15, 1993 (now U.S. Pat. No. 5,410,806, issued May 2, 1995).

BACKGROUND OF THE INVENTION

1. Field of the Invention

This invention relates generally to packaging semiconductor devices, and in particular, to grid array semiconductor packages.

2. Description of the Related Technology

Semiconductor devices such as, for example, integrated circuits have revolutionized the field of electronics by making possible a level of technological sophistication unknown in the days of vacuum tubes and even discrete transistors. An integrated circuit die may comprise, on a small silicon chip, many thousand or even a million or more transistors interconnected together to form complex electronic functions. The complex electronic functions of the integrated circuit chip may require several hundred external connections to a related electronic system.

Simple function integrated circuits have been packaged in ceramic packages for high reliability industrial and military applications and in lower cost molded plastic packages for commercial and consumer products. Recently, very large scale integration (VLSI) integrated circuits have outgrown the connection capacity of either the ceramic or molded plastic packaging systems. The integrated circuit packaging industry has developed more sophisticated packages for VLSI integrated circuits that accommodate the increased number of external connections required to the electronic system.

Several of the VLSI integrated circuit packages having high connection capacity are a plastic pin grid array (PPGA) and a plastic ball grid array (PBGA). The PPGA and PBGA packages differ from the prior molded plastic or ceramic packages in that the PPGA and PBGA are, in effect, miniature multiple layer printed circuit boards having the integrated circuit chip contained within the multiple layers and connected to the various conductive paths of the printed circuit boards. Examples of integrated circuit fabrication for VLSI integrated circuit packages are more fully illustrated in commonly-owned co-pending patent application Ser. No. 07/917,894 entitled "Ball Bump Grid Array Semiconductor Packages" by Michael Rostoker, Chok J. Chia, Mark Schneider, Michael Steidl, Edwin Fulcher and Keith Newman, filed on Jul. 21, 1992 and incorporated by reference herein for all purposes.

As used herein, the term "semiconductor device" refers to a silicon chip or die containing electronic circuitry and is more commonly referred to as a "semiconductor integrated circuit". The term "semiconductor device assembly" or "integrated circuit assembly" refers to the silicon die and associated packaging containing the die, including means for connecting to a system circuit board, and internal connections such as bond wires, of the die to the leads.

Figure 1:
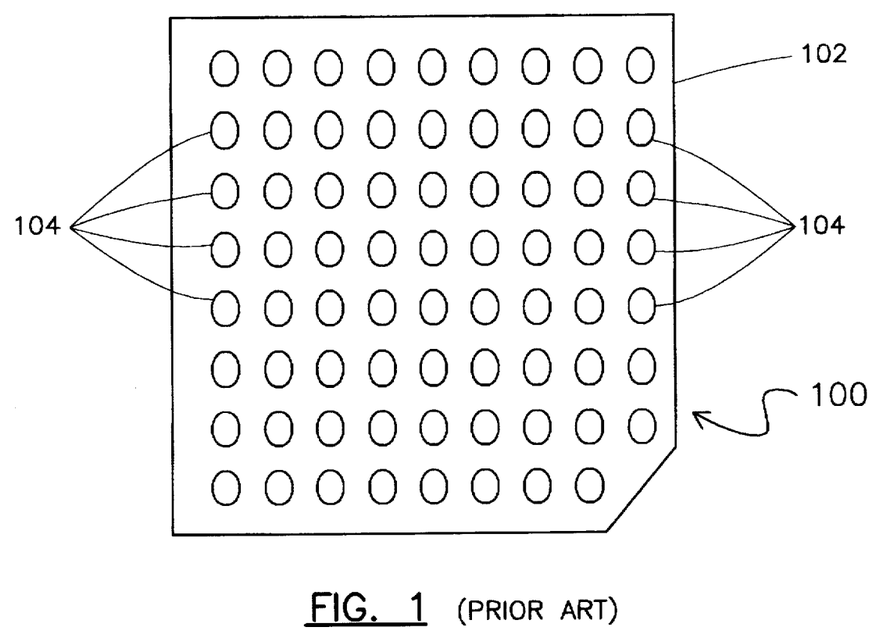
FIG. 1 is a schematic plan view of the bottom of a prior art semiconductor device package.

Referring to FIG. 1, a schematic plan view of the bottom face of a PBGA integrated circuit package 100 is illustrated. A printed wire board (PWB) 102 has a plurality of solder balls 104 attached thereto. The solder balls 104 attach the PWB 102 to a system printed circuit board (not illustrated). The solder balls 104 melt when heated in an oven or by applying sufficiently hot air to the PBGA integrated circuit package 100. This is how the PBGA integrated circuit package 100 is electrically and mechanically connected to a system printed circuit board.

Figure 2:
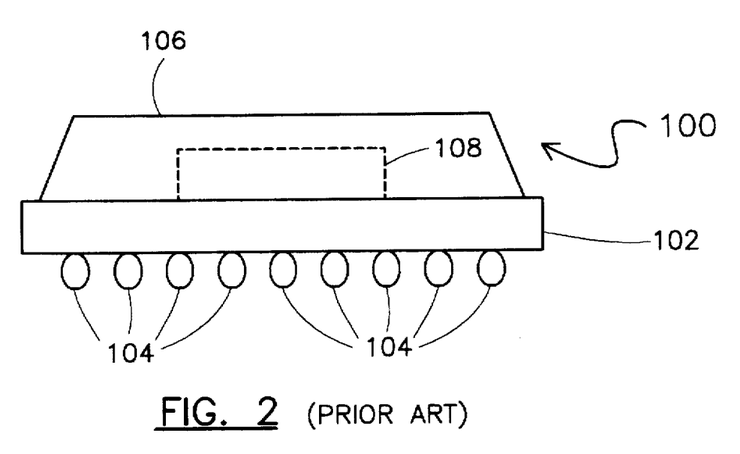
FIG. 2 is a schematic elevational view of the package of FIG. 1.

Referring now to FIG. 2, a schematic elevational view of the PBGA integrated circuit package 100 is illustrated. The PBGA integrated circuit package 100 comprises the PWB 102, solder balls 104, plastic or epoxy encapsulation 106 and an integrated circuit die 108. The circuitry of the integrated circuit die 108 connects to conductive paths on the PWB 102 which in turn connect to the solder balls 104.

Figure 3:
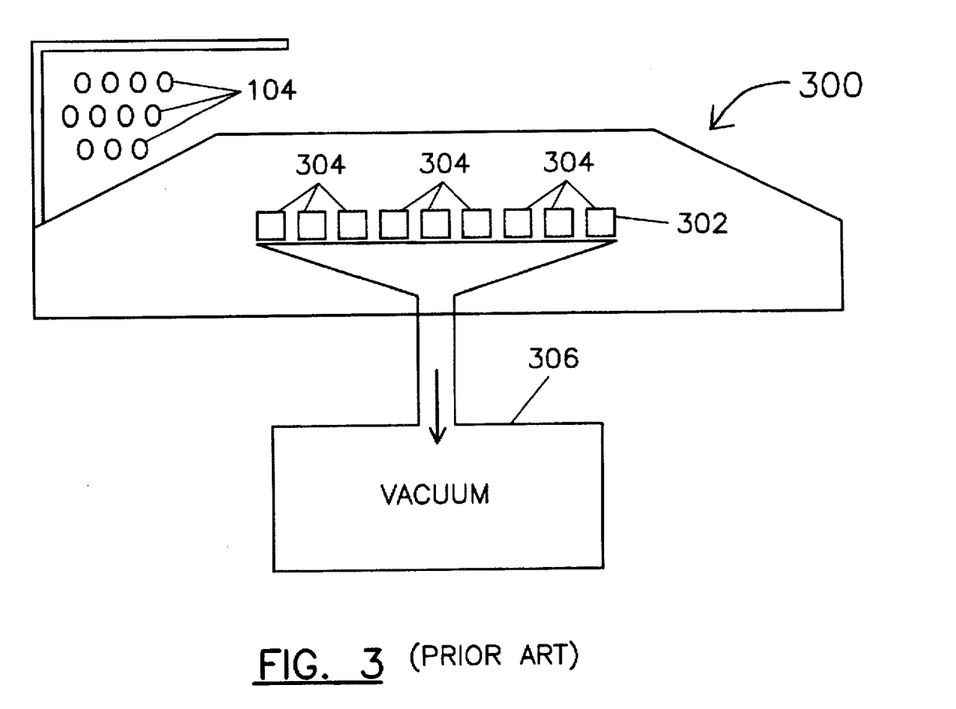
FIG. 3 is a schematic elevational view of a prior art fabrication step.
Figure 4:
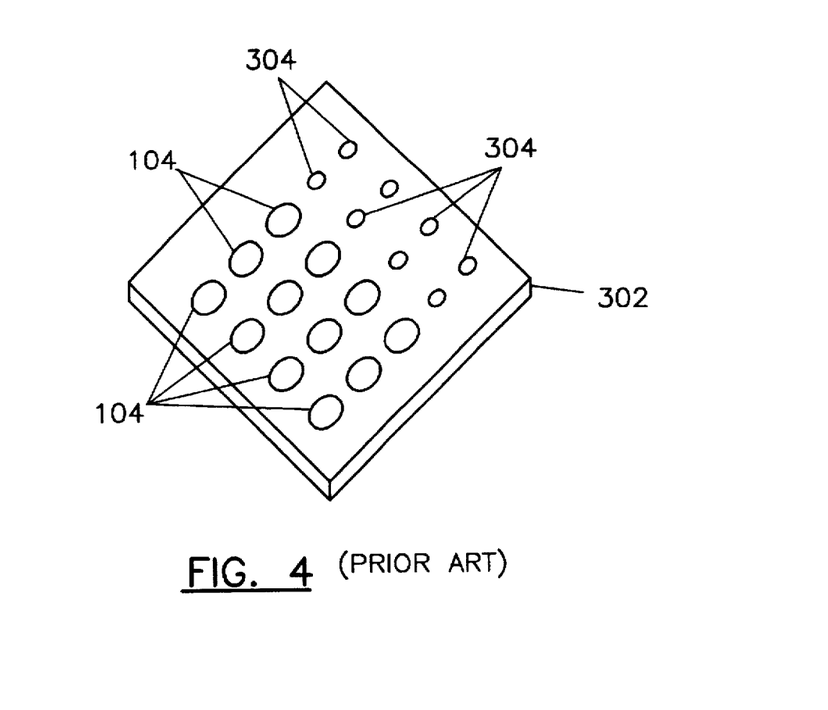
FIG. 4 is a schematic orthogonal view of a prior art fabrication fixture.

Referring now to FIGS. 3 and 4, prior art fabrication equipment are illustrated in schematic elevational and orthogonal views, respectively. A solder ball holding template 302 is used to fixedly align the solder balls 104 in a predetermined desired pattern. The template 302 is placed into a solder ball spreading device 300 which causes individual loose solder balls 104 to randomly pass over the template 302. The template 302 has holes 304 adapted to receive the solder balls 104.

A vacuum 306 is placed on one face of the template 302 while solder balls 104 pass over the other face of the template 302. The solder balls 104 are attracted to the holes 304 by the vacuum 306 therethrough. After all of the holes 304 of the template 302 have a corresponding solder ball 104 thereon, the template 302 holding the desired pattern of solder balls 104 is ready for the next step in the prior art fabrication process.

Figure 5:
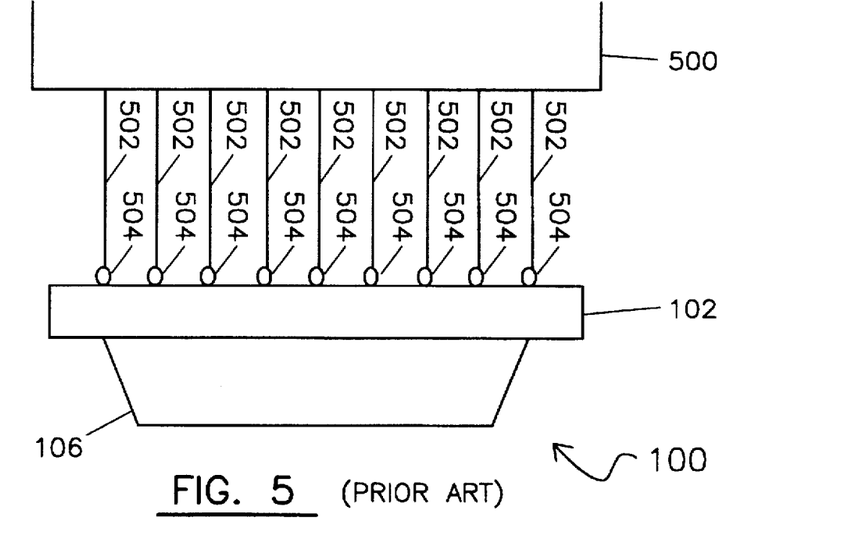
FIG. 5 is a schematic elevational view of a prior art fabrication step.
Figure 6:
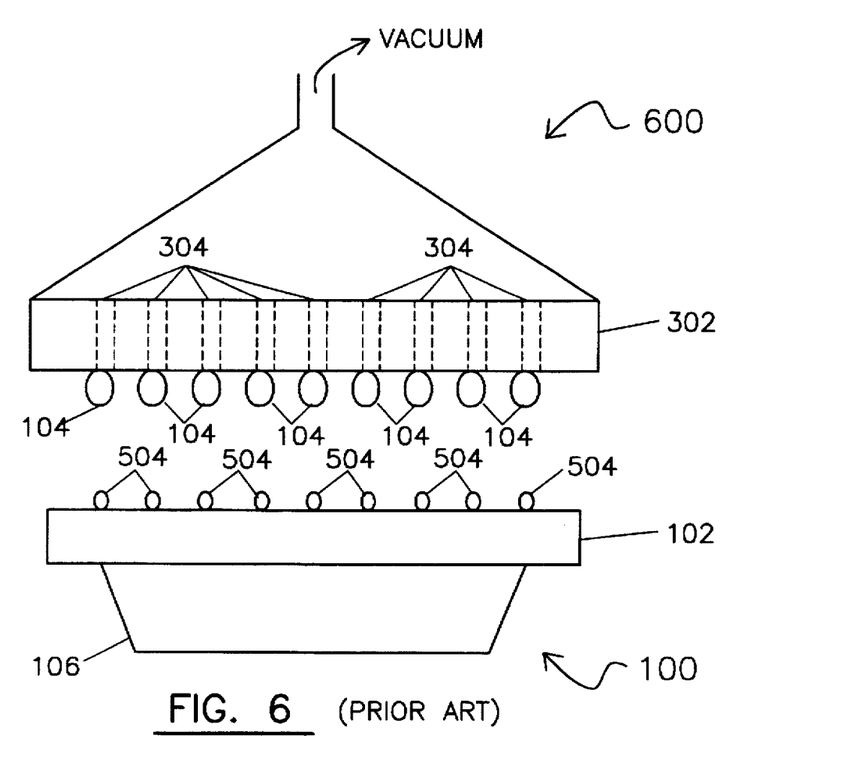
FIG. 6 is a schematic elevational view of another prior art fabrication step.

Referring now to FIGS. 5 and 6, schematic elevational views of two prior art fabrication steps are illustrated. A solder flux dispenser 500 feeds solder flux to dispensing needles 502. The dispensing needles 502 are brought proximately near the bottom of the PWB 102 of the PBGA integrated circuit package 100. Controlled amounts of solder flux are dispensed from the dispensing needles 502 onto selected locations on the bottom of PWB 102. The dispensed solder flux contacts the PWB 102 and forms solder flux droplets 504 thereon.

A "pick and place" robotics system removes the solder ball holding template 302 from the solder ball spreading device 300, maintaining a vacuum on the template 302 so as to hold the solder balls 104 in place in their respective holes 304. Numeral 600 generally represents a robotics system that moves the template and positions it over the PBGA integrated circuit package 100. The template 302 is placed so that the solder balls 104 are in substantial registration with the corresponding solder flux droplets 504. The template is lowered onto the bottom face of the PWB 102 where the solder balls 104 come into contact with the solder flux droplets 504. Vacuum is removed from the template 302 and the solder balls 104 remain on the face of the PWB 102 after the template 302 is withdrawn. Thus, the solder flux droplets 504 and solder balls 104 have been placed over a pattern of connection pads of the PWB 102 (not illustrated). The robotic system 600 is a very complex and expensive electromechanical device that is utilized to mass produce PBGA integrated circuit assemblies.

The solder balls 104 are initially attached to the PWB 102 by first placing solder flux onto selected connection pad areas of the PWB 102 which have been adapted to receive the solder balls 104. The PWB 102 and solder balls 104 are next heated to a point where the solder balls 104 melt, mechanically and electrically attaching themselves to the PWB 102 connection pads (not illustrated). After the solder balls 104 have cooled down, the residue solder flux must be removed from the PWB 102. Several types of solder flux have been utilized in the industry, some require harsh chemicals such as, for example, chloroflourocarbons (CFC) for removal. CFCs have been suspected of causing depletion of the ozone layer. Some of the newer fluxes used may be removed by less harmful means than CFCs, however, they still require a cleaning operation and subsequent disposal of the waste therefrom. The solder balls 104 consist of a mixture of lead and tin. Lead has been linked to brain damage in children and is considered a hazardous material by the Environmental Protection Agency (EPA).

What is needed is a less costly and environmentally safe method and apparatus for connecting semiconductor device assemblies (integrated circuit packages) to electronic system circuit boards. Accordingly, it is desirable to provide a method and system for simply and cost efficiently manufacturing semiconductor device assemblies in a more environmentally safe manner and to utilize materials that are substantially less hazardous to people and the environment.

SUMMARY OF THE INVENTION

Accordingly, it is an object of the present invention to provide an improved method and system for manufacturing semiconductor device assemblies with a reduced number of costly robotic fabrication systems.

Another object of the present invention is to reduce the cost and complexity of equipment used to place external connections onto a semiconductor device assembly.

A further object is to utilize a method and apparatus for applying external connection means where the connection means do not require a cleaning step during fabrication.

Yet another object is to minimize the amount of hazardous materials needed in the manufacture of semiconductor device assemblies.

Still another object is reduce the amount of waste by products that must be disposed of during the manufacture of semiconductor device assemblies.

The present invention accomplishes these objects, in addition to other objects that will be described in the drawings and detailed specification below.

The present invention comprises a method and system of manufacturing semiconductor device assemblies into packages having external electrical connections made of conductive epoxy. The resulting semiconductor device assembly or integrated circuit device assembly includes a planar printed wire board (PWB) or laminated PWBs on which an integrated circuit device is placed. The PWB has connection pads that are adapted to connect to external connection means of a system printed circuit board.

According to one aspect of the invention, a semiconductor device assembly, having a face with-connection pads located thereon, is placed in close contact with a screen printer. The screen printer has a stencil screen therein with a desired pattern for stenciling conductive epoxy onto the face of the semiconductor device assembly. Conductive epoxy is poured into the screen printer near the stencil screen, then squeezed through the screen onto the face of the semiconductor device assembly. The conductive epoxy pushed through the screen onto the device assembly may be utilized as external connection contacts.

After stenciling on the epoxy contacts, the assembly is removed and placed into an oven where the conductive epoxy contacts are partially cured or "B-staged". The semiconductor device assembly is now ready for connection into a system printed circuit "mother board".

The finished device assembly is placed onto a mother board and then both may be placed into a nitrogen oven wherein the B-staged conductive epoxy curing is finished into C-stage. The C-staged conductive epoxy both firmly attaches the device assembly to the mother board and makes good electrical connections therebetween. No intermediate cleaning is required of the device assembly external connections as would be the case with solder balls and flux, nor is hazardous materials such as lead utilized for electrical connections.

According to another aspect of the invention, the system and method of the invention utilizes a plurality of dispensing needles arranged in a desired pattern to dispense conductive epoxy onto a face of a semiconductor device assembly. The deposited conductive epoxy is partially cured to B-stage in an oven. The semiconductor device may then be placed on a printed circuit mother board and heated to complete the cure to C-stage which firmly attaches and electrically connects the semiconductor device assembly to the system mother board. No intermediate cleaning of the device assembly, nor use of hazardous materials for connections, are needed with the present invention.

Therefore, an advantage of the present invention is a reduction in the amount and cost of equipment needed to fabricate semiconductor device assemblies.

Another advantage of the present invention is to reduce cleaning steps and resulting waste disposal in fabricating semiconductor device assemblies.

A feature of the present invention is low cost and ease of implementation of a desired pattern of conductive epoxy contacts onto a semiconductor device assembly.

Another feature is attachment and electrical connection of a semiconductor device assembly to a printed circuit mother board in one step.

Other and further objects, features and advantages will be apparent from the following description of a presently preferred embodiment of the invention, given for the purpose of disclosure and taken in conjunction with the accompanying drawings.

DETAILED DESCRIPTION OF PREFERRED EMBODIMENTS

The present invention comprises an apparatus, method and system of manufacturing semiconductor device assemblies into packages having external electrical connections made of conductive epoxy. The resulting semiconductor device assembly or integrated circuit device assembly includes a planar printed wire board (PWB) or laminated PWBs on which an integrated circuit device is placed.

Figure 7:
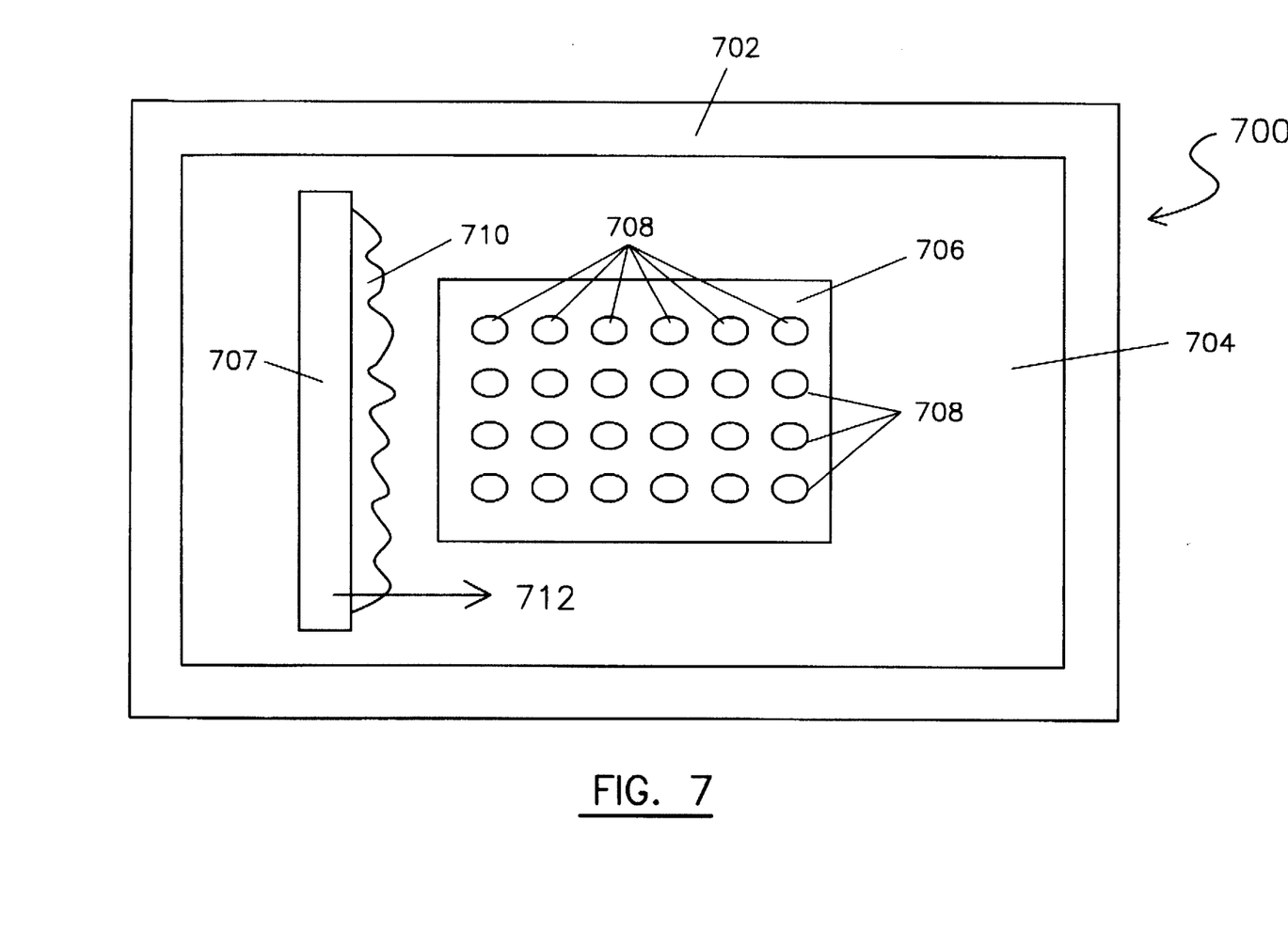
FIG. 7 is a schematic plan view of an embodiment of the present invention.

Referring now to the drawings, the details of preferred embodiments are schematically illustrated. In the drawings like elements have the same number, while similar elements have the same number with a suffix having a different lower case letter. Referring now to FIG. 7, a screen printing system is illustrated in schematic plan view. The screen printing system 700 comprises a frame 702, tray 704 adapted to hold a stencil screen 706 and a squeegee 707. The stencil screen 706 has a desired pattern of holes 708 in which conductive epoxy 710 is evenly distributed therethrough by the squeegee 707 moving in direction 712.

Figure 8:
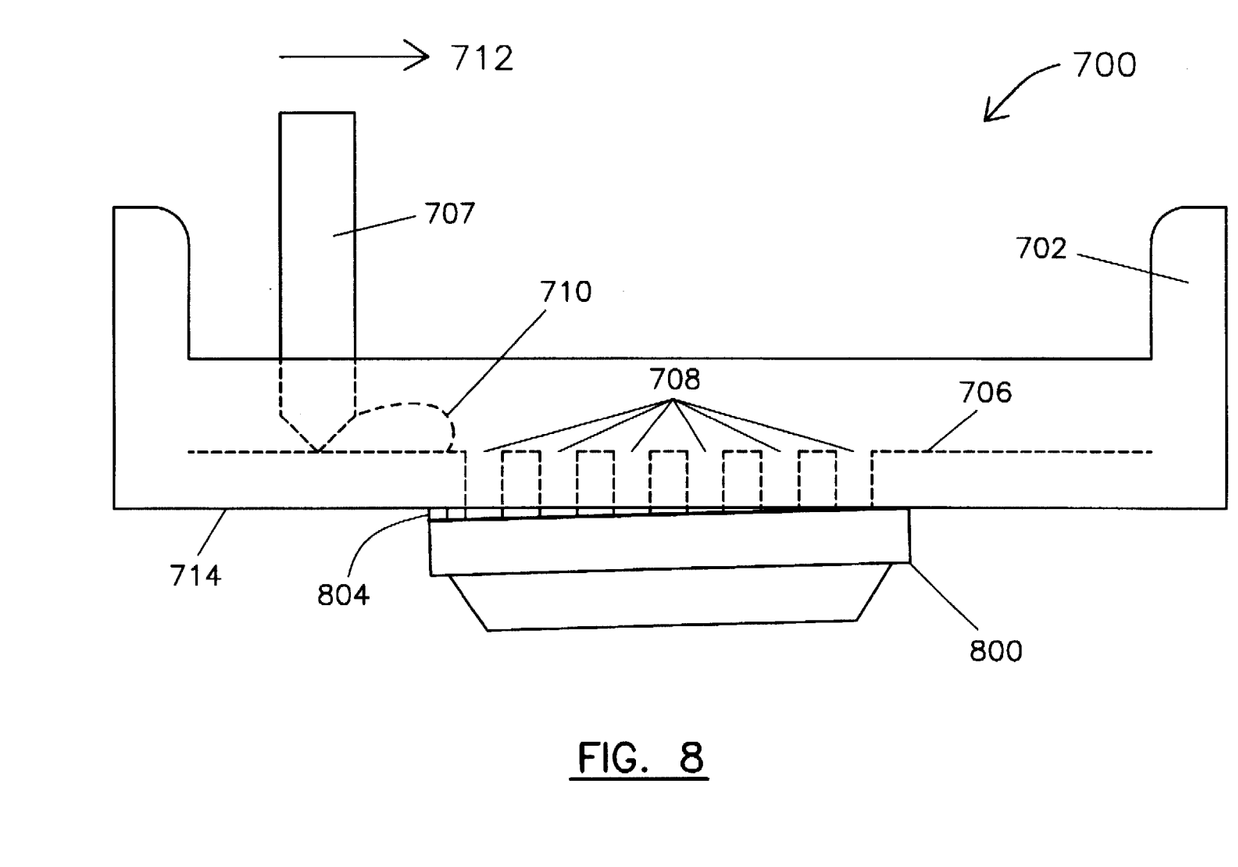
FIG. 8 is a schematic elevational view of the embodiment of FIG. 7.

Referring now to FIG. 8, the screen printing system of FIG. 7 and a semiconductor device assembly 800 are illustrated in schematic elevational view. The bottom face 804 of the semiconductor device assembly 800 is brought in close communication with the bottom face 714 of the stencil screen 706 attached to the frame 702. When the squeegee 707 is moved in the direction 712, the conductive epoxy 710 is evenly pushed through the holes 708 onto the bottom face 804 of the semiconductor device assembly 800. The conductive epoxy 710 pushed through the holes 708 attaches to the bottom face 804 and remains thereon after the semiconductor device assembly 800 is removed from the screen printing system 700.

Figure 9:
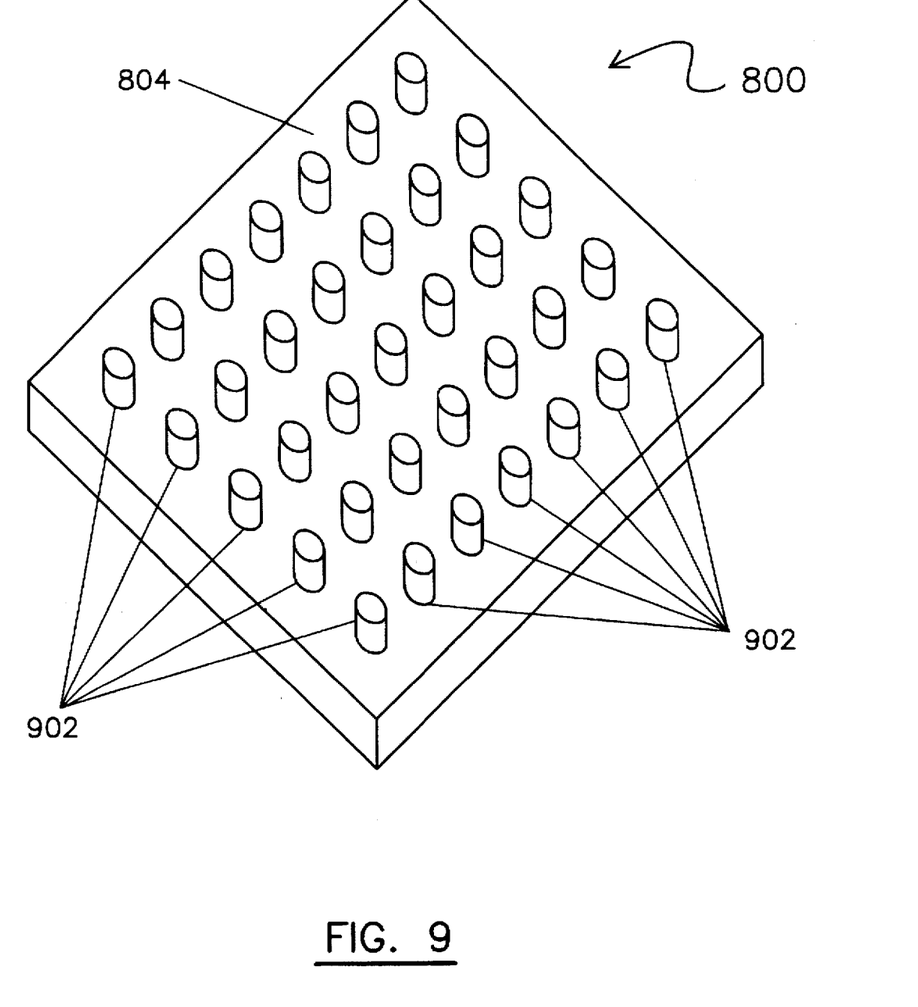
FIG. 9 is a schematic orthogonal view of the bottom of an embodiment of the present invention.

Referring now to FIG. 9, a schematic orthogonal view of the present invention is illustrated. The semiconductor device assembly 800 has conductive epoxy contacts 902 on its bottom face 804 after the stencil screen 706 is removed. The semiconductor device assembly 800 and attached epoxy contacts 902 may be placed into an oven where the epoxy contacts 902 are B-staged. B-stage is an intermediate stage in the reaction of a thermosetting resin in which the material softens when subjected to pressure and heat but does not entirely fuse. The semiconductor device assembly 800 is then withdrawn from the oven ready for use. To which the applicant is aware, the system and method of the present invention is new and novel over the prior art attachment means of solder balls and flux which requires both an intermediate cleaning step and utilizes environmentally questionable materials.

Figure 10:
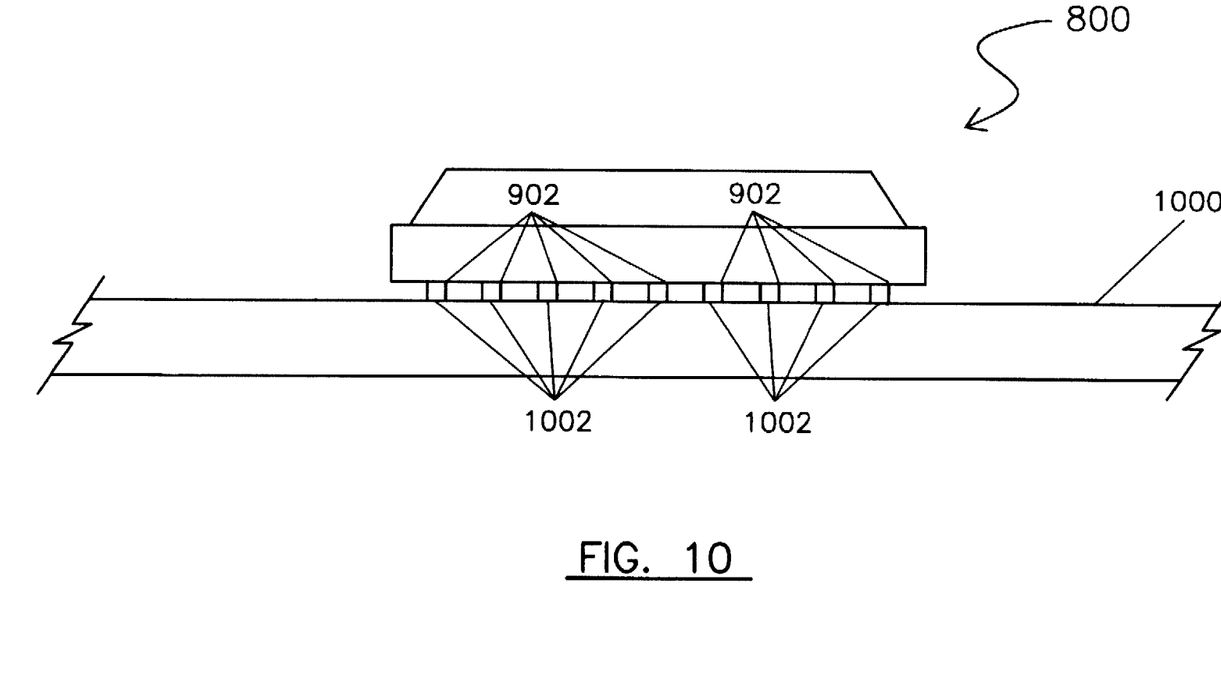
FIG. 10 is a schematic elevational view illustrating the present invention attached to an electronic system printed circuit board.

Referring now to FIG. 10, a schematic elevational view of the embodiment of FIG. 9 is illustrated mounted on a system printed circuit mother board. The printed circuit mother board 1000 has contact pads 1002 on which the conductive epoxy contacts 902 are placed. The mother board 1000 and the semiconductor device assembly 800 may be placed in a nitrogen oven and heated whereby the epoxy contacts 902 will soften, attach to the contacts pads 1002, then finish curing to a C-stage. When the epoxy contacts 902 have cured to a C-stage material, both the semiconductor device assembly 800 and the mother board 1000 are securely attached together with good electrical connection therebetween.

An alternate embodiment of the system and method of the present invention may utilize a plurality of dispensing needles similar to the dispensing needles illustrated in prior art FIG. 5, instead of a screen printer, except that conductive epoxy is dispensed onto assembly bottom face 804 (FIG. 9) instead of solder flux. Conductive epoxy has been used for illustrative purposes herein, but any polymer or thermosetting resin that can be made conductive and cured in both B-stage and C-stage is applicable in the present invention. One skilled in the art of polymer, epoxies and thermosetting resins would readily appreciate the various materials applicable for the uses describe above. In addition, multiple semiconductor device assemblies may be fabricated during one screening and heating step.

The system and method of the present invention, therefore, is well adapted to carry out the objects and attain the ends and advantages mentioned, as well as others inherent therein. While presently preferred embodiments of the invention have been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A system for fabricating a semiconductor device assembly, said system comprising:

means for attaching a semiconductor device to a printed wiring board having conductive paths thereon;

means for connecting the semiconductor device to the conductive paths on the printed wiring board;

means for encapsulating the semiconductor device and part of the printed wiring board having the semiconductor device attached thereto;

means for depositing conductive epoxy onto selected areas of the printed wiring board such that the conductive epoxy is deposited on the printed wiring board at a desired thickness so as to form conductive epoxy contacts adapted for connection to a printed circuit board, the selected areas being electrically connected to the conductive paths which are connected to the semiconductor device; and means for partially staging the deposited conductive epoxy contacts.

2. The system of claim 1, wherein the means for depositing conductive epoxy is a screen stencil in communication with a face of the printed wiring board and through which the conductive epoxy is patterned onto the selected areas of the printed wiring board.

3. The system of claim 1, wherein the means for depositing conductive epoxy is an array of hollow needles having a desired pattern and aligned with a face of the printed wiring board so that the conductive epoxy flows through the hollow needles and forms the desired pattern onto the selected areas of the printed wiring board.

4. The system of claim 1, wherein the semiconductor device is a plurality of integrated circuit dies.

5. The system of claim 1, wherein the semiconductor device is an integrated circuit die.

6. The system of claim 1, wherein the conductive epoxy contacts are arranged in an array.

7. The system of claim 6, wherein the conductive epoxy contacts are arranged in a rectangular array.

8. The system of claim 1, wherein the conductive epoxy contacts are partially staged by heating.

\* \* \* \* \*